United States Patent
Seki et al.

(10) Patent No.: US 7,884,541 B2
(45) Date of Patent: Feb. 8, 2011

(54) ORGANIC ELECTROLUMINESCENT APPARATUS AND ELECTRONIC APPARATUS

(75) Inventors: Shunichi Seki, Suwa (JP); Tsukasa Ota, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 259 days.

(21) Appl. No.: 12/203,635

(22) Filed: Sep. 3, 2008

(65) Prior Publication Data

US 2009/0072724 A1    Mar. 19, 2009

(30) Foreign Application Priority Data

Sep. 14, 2007    (JP)    ............................. 2007-238886

(51) Int. Cl.
*H01L 51/50*    (2006.01)
(52) U.S. Cl. .................... 313/504; 313/506; 445/24
(58) Field of Classification Search ................ 313/504, 313/506; 445/24–25
See application file for complete search history.

(56) References Cited

U.S. PATENT DOCUMENTS 6,771,019 B1 *  8/2004  Wu et al. .................... 313/503
2004/0251820 A1 * 12/2004  Cok et al. ................... 313/506
2005/0156515 A1 *  7/2005  Fukase ........................ 313/504

FOREIGN PATENT DOCUMENTS

JP    A-2002-252083    9/2002

* cited by examiner

*Primary Examiner*—Nimeshkumar D Patel
*Assistant Examiner*—Mary Ellen Bowman
(74) *Attorney, Agent, or Firm*—Oliff & Berridge, PLC

(57) ABSTRACT

An organic electroluminescent apparatus includes a plurality of light-emitting elements each having an organic layer held between a pixel electrode and a counter electrode, and a partition pattern with which the organic layers of the individual light-emitting elements are defined. The partition pattern has a plurality of openings in which the organic layers are respectively provided, the plurality of openings including first openings provided in a peripheral region of a element area, in which the light-emitting elements are arranged, and second openings provided in a region closer to the center of the element area than the region where the first openings are provided. The first openings have larger planar dimensions than those of the second openings.

3 Claims, 7 Drawing Sheets

ORGANIC ELECTROLUMINESCENT APPARATUS AND ELECTRONIC APPARATUS

BACKGROUND

1. Technical Field

The present invention relates to organic electroluminescent apparatuses and electronic apparatuses.

2. Related Art

Organic light-emitting diodes (OLEDs), i.e., organic electroluminescent (EL) devices included in thin and light self-luminous displays are attracting attention. An organic EL device includes at least one organic thin film layer composed of an organic material and held between a pixel electrode and a counter electrode, as disclosed in JP-A-2002-252083, for example.

Characteristics of organic thin films included in organic EL devices are easily altered and deteriorated by oxygen or moisture. Such alteration and deterioration of characteristics shortens the lifetime of organic EL devices. Deterioration of organic thin films tends to occur first in a peripheral region of a element area that easily allow entry of oxygen or moisture. However, it takes time before organic thin films provided in a central region of the element area start to be deteriorated. This means that, while light-emitting elements in the central region are still capable of emitting light, light-emitting elements in the peripheral region may become incapable of emitting light. In such an event, an organic EL apparatus itself becomes unusable (a first problem).

Organic thin films can be formed by, for example, an application method, in which a solution, i.e., ink, containing a material for organic thin films (such as functional polymer) and a solvent is applied to a substrate and is dried thereon.

In general, the drying rate of ink tends to be higher in a peripheral region of the substrate than in a central region of the substrate. This is because the concentration of the solvent in an atmosphere around the peripheral region of the substrate tends to be lower than that in an atmosphere above the central region of the substrate. Such nonuniformity in the drying rate often triggers nonuniformity in the thickness of organic thin films to be formed. Further, nonuniformity in the thickness of organic thin films often triggers nonuniformity in the brightness and color of light to be emitted.

In view of such circumstances, a technique is disclosed in JP-A-2002-252083 in which a group of dummy banks are provided around a display pixel area (an effective optical area), in the same shape and at the same pitches as those for display pixels, and an ink composition containing an organic EL material is applied not only to the display pixel area but also to the region around the display pixel area, whereby organic EL thin films are formed. In this technique, since the ink composition is also applied to the dummy area around the display pixel area, the concentration of a solvent in an atmosphere above the display pixel area can be made almost uniform. Thus, the drying rates of ink in individual pixels arranged in the display pixel area can be made almost uniform. Consequently, nonuniformity in the thickness of the organic thin films can be reduced. The organic thin films formed in the dummy area, i.e., the organic thin films formed in the peripheral region of the substrate, are not used for light emission. Therefore, difference between the thicknesses of the organic thin films in the peripheral region of the substrate and in the display pixel area does not affect the light emission characteristic.

In the organic EL apparatus disclosed in JP-A-2002-252083, however, a belt-like space having a width of several millimeters needs to be reserved for the dummy area on the substrate on which organic EL devices are to be formed. Reservation of such a space prevents reduction in the frame width of the organic EL apparatus (a second problem).

SUMMARY

An advantage of some aspects of the invention is that it provides an organic EL apparatus and an electronic apparatus capable of solving at least one of the first and second problems described above.

According to a first aspect of the invention, an organic electroluminescent apparatus includes a plurality of light-emitting elements each having an organic layer held between a pixel electrode and a counter electrode, and a partition pattern with which the organic layers of the individual light-emitting elements are defined. The partition pattern has a plurality of openings in which the organic layers are respectively provided, the plurality of openings including first openings provided in a peripheral region of a element area, in which the light-emitting elements are arranged, and second openings provided in a region closer to the center of the element area than the region where the first openings are provided. The first openings have larger planar dimensions than those of the second openings.

In a typical organic EL apparatus, the peripheral region of the element area easily allows entry of oxygen or moisture and therefore deterioration of the light-emitting elements starts to occur from the peripheral region and gradually progresses toward the center. Considering a single light-emitting element, deterioration of the organic layer starts to occur from a peripheral portion thereof and gradually progresses toward the center thereof. In the first aspect of the invention, the planar dimensions of the organic layers provided in the first openings positioned in the peripheral region of the element area are larger than those of the organic layers provided in the second openings positioned closer to the center of the element area. Therefore, even after the organic layers of the light-emitting elements provided in the peripheral region of the element area start to be deteriorated, it takes a long time before central portions of the same organic layers are deteriorated. Moreover, unless a highly conductive organic material for hole injection/transport is used, each organic layer emits light mainly at a central portion thereof, where the organic layer overlaps both the pixel electrode and the counter electrode, thereby allowing an effective current flow. In contrast, the organic layer does not emit light at a peripheral portion thereof, where there is no current flow. This means that, in the first aspect of the invention, it takes a long time before the organic layers of the light-emitting elements provided in the peripheral region of the element area have portions thereof that actually contribute to light emission deteriorated. Consequently, the lifetime of the organic EL apparatus can be extended.

In the organic EL apparatus according to the first aspect of the invention, it is preferable that the pixel electrodes of the respective light-emitting elements have substantially the same planar dimensions. In this case, even if there are some differences in the planar dimensions among the organic layers of the light-emitting elements, portions of the organic layers that have effective current flows and actually contribute to light emission all have substantially the same planar dimensions.

In the organic EL apparatus according to the first aspect of the invention, it is preferable that the pixel electrodes be arranged at constant pitches. In this case, portions of the light-emitting elements that actually emit light are arranged at constant pitches. Therefore, viewers will not feel that something is wrong. Moreover, the apparatus can be designed easily.

According to a second aspect of the invention, an organic electroluminescent apparatus includes a plurality of light-emitting elements each having an organic layer held between a pixel electrode and a counter electrode, and a partition pattern with which the organic layers of the individual light-emitting elements are defined. The partition pattern includes a first partition pattern having a plurality of first open portions and a second partition pattern having a plurality of second open portions and, in cross-sectional view, being disposed closer to the counter electrode than the first partition pattern. The organic layers are respectively provided in the first open portions and the second open portions. Each of the first open portions allows at least a portion of the corresponding pixel electrode to be in contact with the corresponding organic layer and, in plan view, is positioned in the corresponding second open portion. Some of the second open portions provided in a peripheral region of a element area, in which the light-emitting elements are arranged, have larger planar dimensions than those of other second open portions provided in a region closer to the center of the element area than the region where the some of the second open portions are provided. In this case, the planar dimensions of the organic layers provided in the second open portions positioned in the peripheral region of the element area are larger than those of the organic layers provided in the second open portions positioned closer to the center of the element area. Therefore, even after the organic layers of the light-emitting elements provided in the peripheral region of the element area start to be deteriorated, it takes a long time before central portions of the same organic layers are deteriorated. Moreover, unless a highly conductive organic material for hole injection/transport is used, each organic layer emits light mainly at a central portion thereof, where the organic layer overlaps both the pixel electrode and the counter electrode, thereby allowing an effective current flow. In contrast, the organic layer does not emit light at a peripheral portion thereof, where there is no current flow. This means that it takes a long time before the organic layers of the light-emitting elements provided in the peripheral region of the element area have portions thereof that actually contribute to light emission deteriorated. Consequently, the lifetime of the organic EL apparatus can be extended.

In the organic EL apparatus according to the second aspect of the invention, it is preferable that all the first open portions have substantially the same planar dimensions. In this case, even if there are some differences in the planar dimensions among the organic layers of the light-emitting elements because of differences in the planar dimensions of the second open portions, portions of the organic layers that have effective current flows and actually contribute to light emission all have substantially the same planar dimensions because planar dimensions of all the first open portions are substantially the same.

In the organic EL apparatus according to the second aspect of the invention, it is preferable that the pixel electrodes be arranged at constant pitches. In this case, portions of the light-emitting elements that actually emit light are arranged at constant pitches. Therefore, viewers will not feel that something is wrong. Moreover, the apparatus can be designed easily.

According to a third aspect of the invention, an electronic apparatus includes the organic electroluminescent apparatus according to the first or second aspect of the invention.

BRIEF DESCRIPTION OF THE DRAWINGS

The invention will be described with reference to the accompanying drawings, wherein like numbers reference like elements.

FIG. 73 is another cross-sectional view of the color filter panel showing the method for manufacturing the same.

Figure 1:
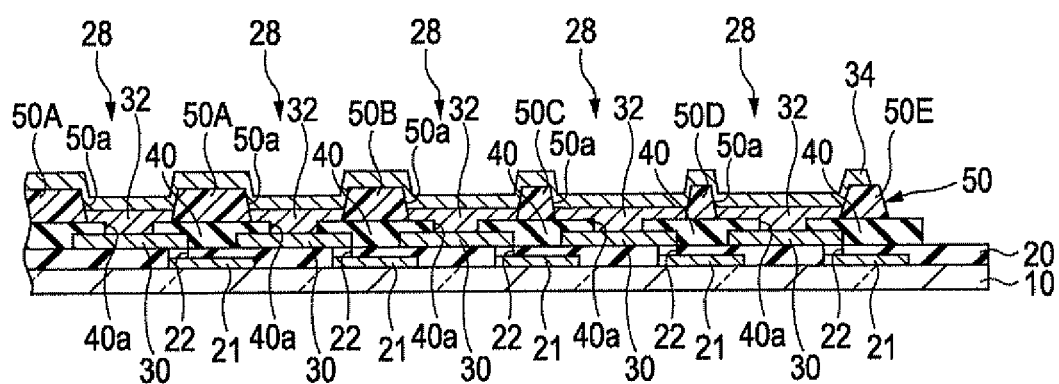
FIG. 1 is a cross-sectional view of an organic EL apparatus according to a first embodiment of the invention.

DESCRIPTION OF EXEMPLARY
EMBODIMENTS

Embodiments of the invention will now be described with reference to the accompanying drawings. In the drawings, components are shown in appropriate scales regardless of the actual dimensions.

First Embodiment

Figure 2:
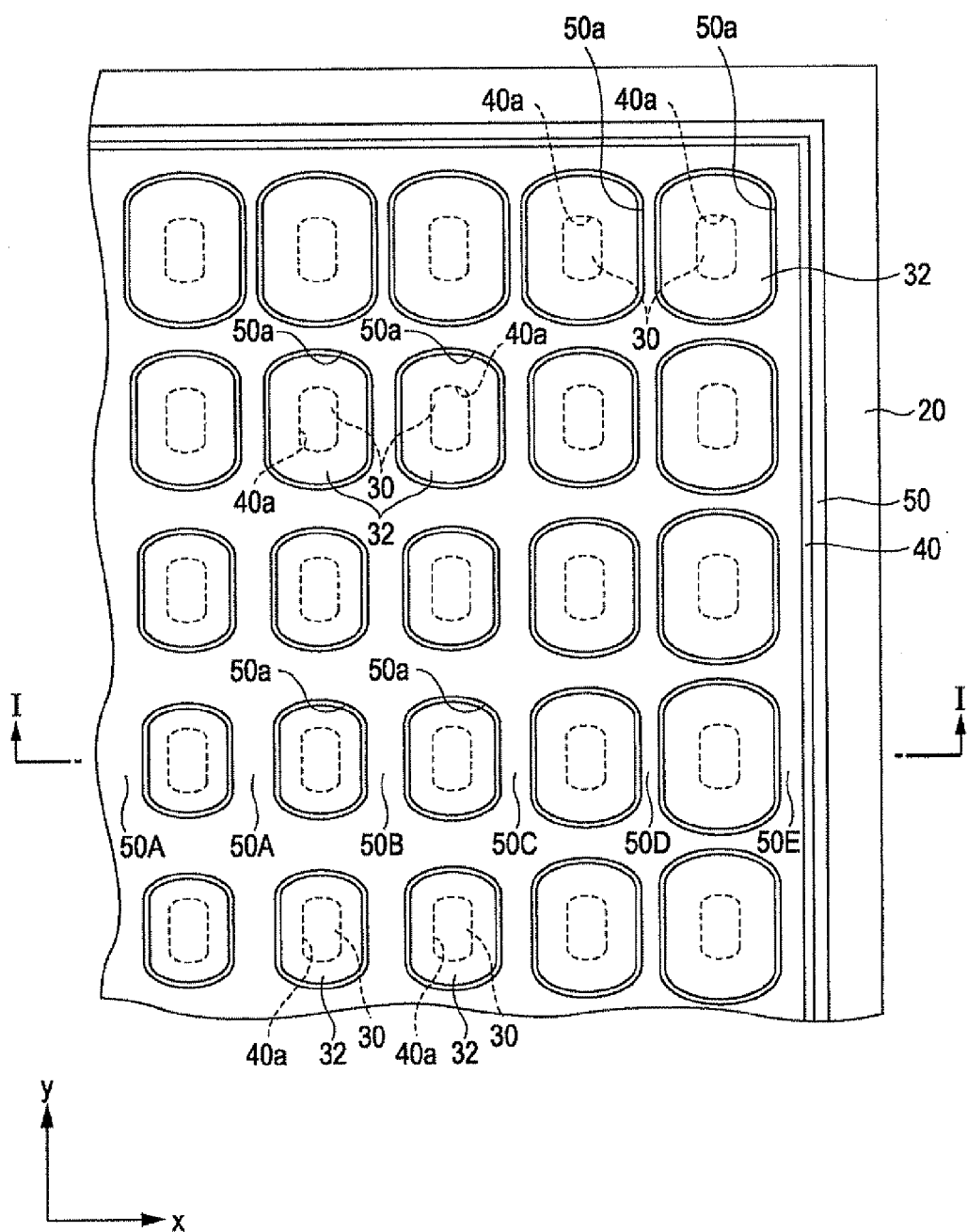
FIG. 2 is a plan view of the organic EL apparatus shown in FIG. 1, without a counter electrode.

FIG. 1 is a cross-sectional view of an organic EL apparatus according to a first embodiment of the invention. FIG. 2 is a plan view of the organic EL apparatus without a counter electrode 34. More specifically, FIG. 1 is a cross-sectional view taken along the line I-I in FIG. 2.

Referring to FIG. 1, the organic EL apparatus includes a substrate 10 and an insulator layer 20 disposed on the substrate 10. The insulator layer 20 is composed of silicon oxide or silicon nitride, for example. A plurality of thin film transistors (TFTs) 21 and wires (not shown) for supplying power to a plurality of light-emitting devices (organic EL devices) 28 are embedded in the insulator layer 20.

The light-emitting elements 28 are provided on the insulator layer 20. Each of the light-emitting elements 28 includes a positive electrode, a negative electrode, and an organic layer (organic thin film) held therebetween. More specifically, the light-emitting element 28 includes an individual pixel electrode 30 and an individual organic layer 32. The counter electrode 34, serving as a common electrode, is provided over the organic layers 32 of all the light-emitting elements 28. In the first embodiment, the pixel electrodes 30 serve as positive electrodes and the counter electrode 34 serves as a negative electrode. Alternatively, the pixel electrodes 30 may serve as negative electrodes and the counter electrode 34 may serve as a positive electrode. The organic layer 32 includes at least one of the following: a light-emitting layer, a hole injection layer, a hole transport layer, an electron blocking layer, a hole blocking layer, an electron transport layer, and an electron injection layer.

The insulator layer 20 has a plurality of through holes 22. Conductors are disposed in the respective through holes 22, thereby electrically connecting the TFTs 21 and the pixel electrodes 30.

To define the individual light-emitting elements 28, a pattern of banks, i.e., a bank pattern (a partition pattern), is provided on the insulator layer 20. The bank pattern includes two layers: a liquid affinity layer (first partition pattern) 40 and a liquid-repellent layer (second partition pattern) 50. The liquid affinity layer 40 is composed of an inorganic insulating material such as silicon oxide or silicon nitride. The liquid-repellent layer 50 is composed of a resinous insulating material such as acryl, epoxy, or polyimide. The liquid affinity layer 40 includes banks of a uniform cross-sectional thickness. The liquid-repellent layer 50 includes banks 50A, 50B, 50C, 50D, and 50E, which will be described separately below.

Referring to FIGS. 1 and 2, the liquid affinity layer 40 has a plurality of openings (first open portions) 40a, and the liquid-repellent layer 50 has a plurality of openings (second open portions) 50a. The openings 40a overlap the openings 50a, respectively. Each overlapping pair of the opening 40a and the opening 50a communicate with each other, thereby forming a single pixel opening. In plan view, the opening 40a is positioned in the opening 50a. Each pixel opening overlaps the corresponding pixel electrode 30 and receives the corresponding organic layer 32. The pixel electrode 30 and the organic layer 32 are in contact with each other through the opening 40a. The counter electrode 34 shared between the light-emitting elements 28 spreads over the liquid-repellent layer 50 of the bank pattern in such a manner as to be in contact with the organic layers 32 through the pixel openings.

The pixel electrodes 30 are arranged at substantially constant pitches in the x and y directions in FIG. 2 and have the same planar dimensions. The openings 40a in the liquid affinity layer 40 are also arranged at constant pitches in the x and y directions and have substantially the same planar dimensions. The pixel electrodes 30 are in contact with the organic layers 32 through the openings 40a. A current flows via the contacts between the pixel electrodes 30 and the organic layers 32. Unless a highly conductive organic material for hole injection/transport is used, each organic layer 32 emits light mainly at a central portion thereof (a portion overlapping the opening 40a), where the organic layer 32 overlaps both the positive electrode and the negative electrode, thereby allowing an effective current flow. In contrast, the organic layer 32 does not emit light at a peripheral portion thereof, where there is no current flow. This means that effective light-emitting portions of the respective light-emitting elements 28 are arranged at constant pitches in the x and y directions in FIG. 2 and have the same planar dimensions.

The organic EL apparatus described above may be of any of the following: a bottom emission type, a top emission type, and a dual emission type. Materials for the substrate 10, the pixel electrodes 30, and the counter electrode 34 are appropriately determined according to the emission type of the organic EL apparatus.

In FIGS. 1 and 2, an area covered with the bank pattern can be regarded as a element area in which a plurality of the light-emitting elements 28 are arranged. Generally, banks of the liquid-repellent layer 50 provided in a peripheral region of the element area have widths smaller than those of banks of the liquid-repellent layer 50 provided in a central region of the element area. Specifically, as shown in FIG. 1, the bank 50D, which is the second outermost bank of the liquid-repellent layer 50, is formed with a width smaller than that of the bank 50C adjacent thereto on the inner side. The bank 50C is formed with a width smaller than that of the bank 50B adjacent thereto on the inner side. The bank 50B is formed with a width smaller than that of the bank 50A adjacent thereto on the inner side. Exceptionally, the bank 50E, which is the outermost bank, is formed with a width larger than that of the bank 50D adjacent thereto on the inner side. Alternatively, the bank 50E may be formed with a width smaller than that of the bank 50D.

Banks of the liquid-repellent layer 50 in the central region (including a region not shown) of the element area have the same width as that of the bank 50A. The central region of the element area occupies a large proportion of the element area. Therefore, a large proportion of banks of the liquid-repellent layer 50 are actually formed with the same width as the bank 50A.

As described above, in the peripheral region of the element area, widths of the banks of the liquid-repellent layer 50 between adjacent pixels in the x direction are generally smaller toward the outer sides of the peripheral region of the element area in the x direction in FIG. 2 (including the outer side not shown). As shown in FIG. 2, in the peripheral region of the element area, widths of the banks of the liquid-repellent layer 50 between adjacent pixels in the y direction are smaller toward the outer sides of the peripheral region of the element area in the y direction in FIG. 2.

Such differences in the width of the banks of the liquid-repellent layer 50 make the planar dimensions of the openings 50a provided in the peripheral region of the element area be larger than those of the openings 50a provided in the central region of the element area. The planar dimensions and depths of the openings 40a and the depths of the openings 50a are substantially uniform in any region. Accordingly, the pixel openings provided in the peripheral region of the element area have larger capacities. Additionally, in the peripheral region of the element area, since the planar dimensions of the openings 50a become larger toward the outer sides, the capacities of the pixel openings become larger likewise.

Figure 3:
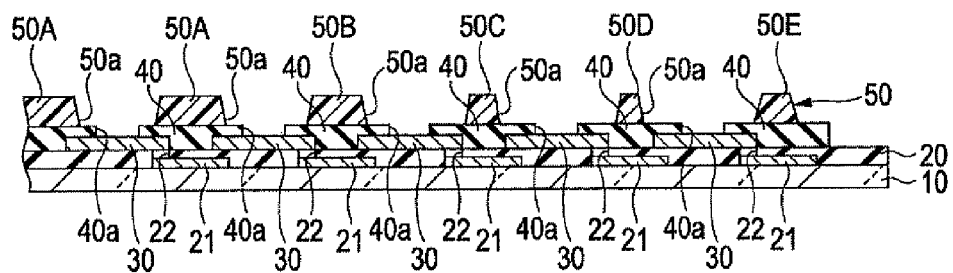
FIG. 3 is a cross-sectional view showing a half-finished product of the organic EL apparatus shown in FIG. 1.

Next, a method for manufacturing the organic EL apparatus will be described. First, a half-finished product shown in FIG. 3 is manufactured. Specifically, by a known method, wires (not shown), the TFTs 21, and the insulator layer 20 are formed on the substrate 10, and subsequently a pattern of the pixel electrodes 30 is formed on the insulator layer 20. Next, the liquid affinity layer 40 serving as a part of the bank pattern is formed with a uniform thickness by a known method such as spin coating, spray coating, roll coating, dye coating, dip coating, chemical vapor deposition (CVD), or sputtering, and then is subjected to photolithographic etching, for example, whereby the openings 40a are provided. Thus, central portions of the respective pixel electrodes 30 are exposed. The etching may be either dry etching or wet etching.

Further, the liquid-repellent layer 50 is formed with a uniform thickness on the structure obtained as above by a known method such as spin coating, spray coating, roll coating, dye coating, or dip coating, and is subjected to photolithographic etching, for example, whereby the openings 50a are provided. Thus, central portions of the respective pixel electrodes 30 are exposed.

In this manner, the half-finished product having a bank pattern shown in FIG. 3 is obtained.

In addition to the above process, oxygen-plasma treatment for giving a liquid affinity characteristic and $CF_4$ plasma treatment for giving liquid-repellency may be performed. With liquid affinity treatment, the liquid affinity characteristic of the liquid affinity layer 40 with respect to a liquid material for the organic layers 32 can be improved. On the other hand, with liquid-repellent treatment, the liquid-repellency of the liquid-repellent layer 50 with respect to a liquid material for the liquid affinity layer 40 can be improved. By performing such plasma-treatment processes, even if a material not originally having liquid repellency is used for forming the liquid-repellent layer 50, the material can be made into the liquid-repellent layer 50 while the liquid affinity characteristic of the liquid affinity layer 40 is maintained.

Figure 4:
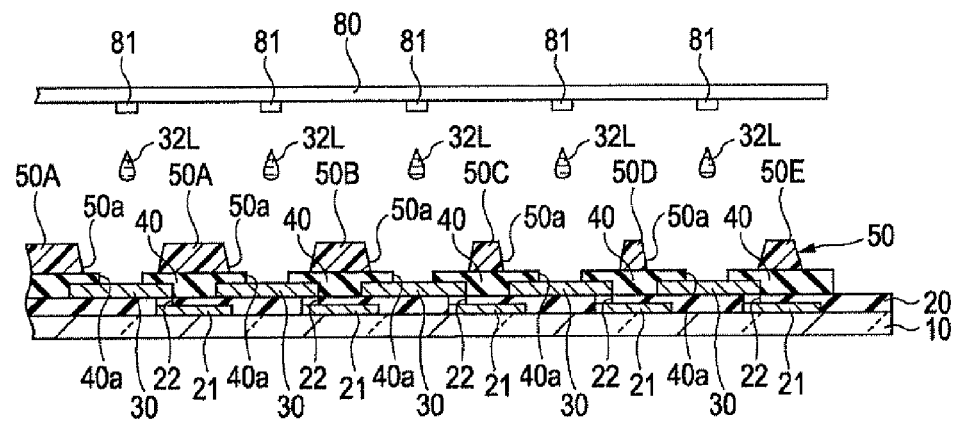
FIG. 4 is a cross-sectional view showing a process, which is included in a method for manufacturing the organic EL apparatus shown in FIG. 1, performed after the half-finished product shown in FIG. 3 is obtained.

Nest, referring to FIG. 4, liquid 32L, which is a material for the organic layers 32, is distributed into the pixel openings. The liquid 32L is ink, for example, containing a solvent such as water or an organic solvent. In the solvent, a conjugated-polymer or low-molecular material to become the organic layers 32 is dispersed or dissolved as a solute. The liquid 32L can be supplied by an ink jet method, a jet dispensing method, or a dispensing method, for example. In the first embodiment, the ink jet method is taken as an example.

Figure 5:
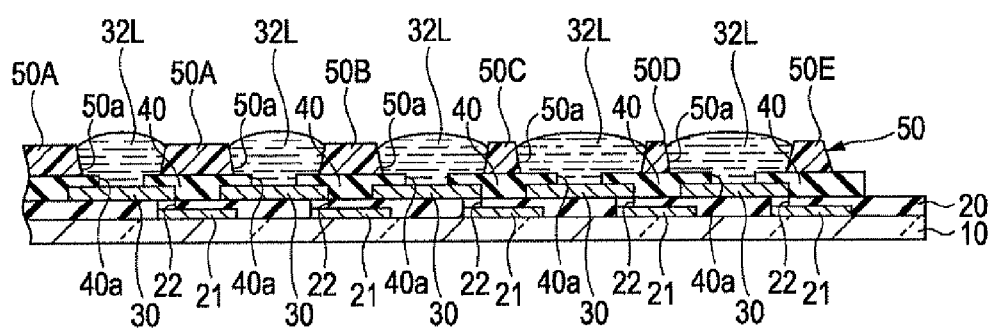
FIG. 5 is a cross-sectional view showing a process subsequent to the process shown in FIG. 4.

Referring to FIG. 4, an ink jet head 80 is driven to eject the liquid 32L from nozzles 81 of the ink jet head 80 toward the pixel openings, whereby the liquid 32L is supplied to all the pixel openings. As described above, since the planar dimensions of the openings 50a provided in the peripheral region of the element area are larger than those of the openings 50a provided in the central region of the element area, the pixel openings in the peripheral region of the element area have larger capacities than those of the pixel openings in the central region. In accordance with this configuration, referring to FIG. 5, larger amounts of liquid 32L, which is the material for the organic layers 32, are distributed into the pixel openings provided in the peripheral region of the element area than in the central region. Further, in the peripheral region of the element area, larger amounts of liquid 32L are distributed into the pixel openings provided closer to the outer sides.

To supply larger amounts of liquid 32L in the pixel openings closer to the outer sides, any one or any combination of the following methods may be used:

(1) The current or voltage to be applied to piezoelectric elements that control the amount of droplets to be supplied from nozzles is changed in accordance with positions of the pixel openings, whereby the amount of a droplet that forms a single dot is changed.

(2) The number of pulses to be applied to piezoelectric elements that control the amount of droplets to be supplied from nozzles is changed in accordance with positions of the pixel openings, whereby the number of droplets to be supplied per pixel opening is changed.

(3) The number of nozzles to be used per pixel opening is changed in accordance with positions of the pixel openings, whereby the number of droplets to be supplied per pixel opening is changed.

Figure 6:
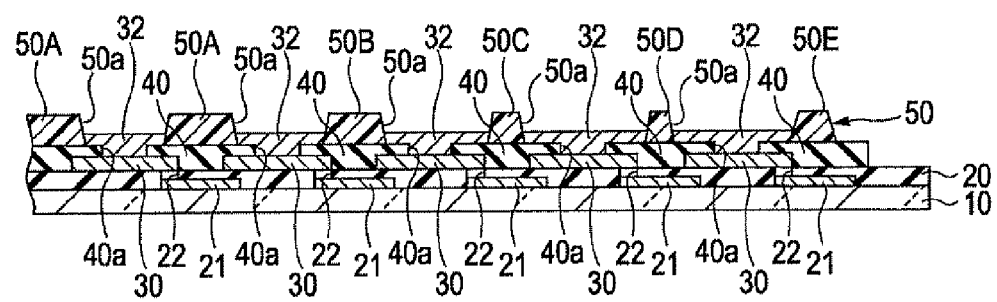
FIG. 6 is a cross-sectional view showing a process subsequent to the process shown in FIG. 5.

Next, the liquid 32L distributed to the pixel openings is dried under vacuum. Consequently, referring to FIG. 6, the organic layers 32 are obtained. In addition, to dry the liquid 32L more sufficiently, the substrate 10 may be annealed. During this drying process, the solvent (water or an organic solvent) contained in the organic layers 32 is removed.

Subsequently, the counter electrode 34 shown in FIG. 1 is formed by a known method. It is preferable that a sealing process be performed for providing a sealing film or a sealing cap (not shown) over the structure shown in FIG. 1.

In the first embodiment, the planar dimensions of the openings 50a provided in the peripheral region of the element area are larger than those of the openings 50a provided in the central region of the element area. This means that, in the process for distributing the liquid 32L, which is the material for the organic layers 32, larger amounts of liquid 32L can be provided to the pixel openings in the peripheral region of the element area (see FIG. 5). Therefore, a larger amount of solvent is evaporated in the peripheral region of the element area, whereby variation in the concentration of the solvent in an atmosphere above the entirety of the element area can be reduced. Specifically, the concentration of the solvent in an atmosphere around the peripheral region becomes close to that in an atmosphere above the central region. Thus, variation in the drying rate of the liquid 32L in the light-emitting elements 28 arranged in the element area can be reduced. Consequently, nonuniformity in the thickness of the organic layers 32 included in the light-emitting elements 28 can be reduced, leading to a reduction of nonuniformity in the brightness and color of light to be emitted. Moreover, unlike the use of a dummy area in the known art (such as JP-A-2002-252083), the light-emitting elements 28 provided in the peripheral region of the element area are also used for light emission. This suppresses increase in the dimensions of a region not contributive to light emission, leading to reduction in the frame width of the organic EL apparatus.

In a typical organic EL apparatus, the peripheral region of the element area easily allows entry of oxygen or moisture and therefore deterioration of the light-emitting elements 28 starts to occur from the peripheral region and gradually progresses toward the central region. Considering a single light-emitting element 28, deterioration of the organic layer 32 starts to occur from a peripheral portion thereof and gradually progresses toward a central portion thereof. In the first embodiment, the planar dimensions of the organic layers 32 of the light-emitting elements 28 provided in the peripheral region of the element area are larger than those of the organic layers 32 of the light-emitting elements 28 provided in the central region of the element area. Therefore, even after the organic layers 32 of the light-emitting elements 28 provided in the peripheral region of the element area start to be deteriorated, it takes a long time before central portions of the same organic layers 32 are deteriorated. Moreover, each organic layer 32 emits light mainly at a central portion thereof (a portion overlapping the opening 40a), where the organic layer 32 overlaps both the positive electrode and the negative electrode, thereby allowing an effective current flow. In contrast, the organic layer 32 does not emit light at a peripheral portion thereof, where there is no current flow. This means that, in the first embodiment, it takes a long time before the organic layers 32 of the light-emitting elements 28 provided in the peripheral region of the element area have portions thereof that actually contribute to light emission deteriorated. Consequently, the lifetime of the organic EL apparatus can be extended.

While the first embodiment concerns a method in which the organic layers 32 are formed by an ink jet method, a jet dispensing method, or a dispensing method, the organic layers 32 may be formed by deposition. Also in the case where the organic layers 32 are formed by deposition, it takes a long time before the organic layers 32 of the light-emitting elements 28 provided in the peripheral region of the element area have portions thereof that actually contribute to light emission deteriorated, as described above. Consequently, the lifetime of the organic EL apparatus can be extended.

In addition, while the first embodiment concerns a case of forming the light-emitting elements 28 of a single color, the above-described method can also be applied to a case where a element area includes groups of light-emitting sub-pixels having colors of red, green and blue. Also in such a case, the same advantageous effect can be obtained.

Second Embodiment

Figure 7A:
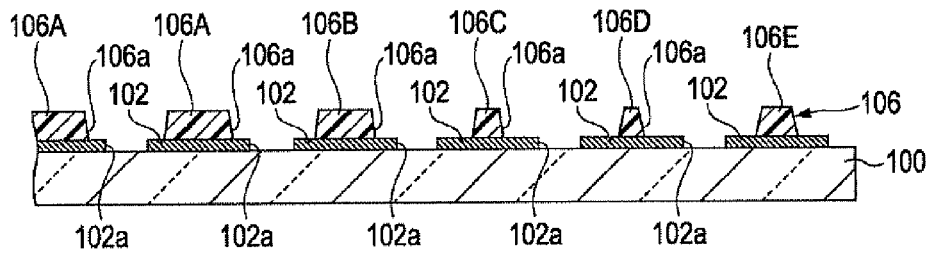
FIG. 7A is a cross-sectional view of a color filter panel according to a second embodiment of the invention, showing a method for manufacturing the same.

FIGS. 7A to 7D are cross-sectional views of a color filter panel showing a method for manufacturing a color filter panel according to a second embodiment of the invention. FIG. 8 is a plan view of the color filter panel as a finished product. More specifically, FIGS. 7A to 7D are each a cross-sectional view taken along the line VII-VII in FIG. 8. The color filter panel includes a substrate 100 composed of a transparent material such as glass or transparent resin, color filters 104 (104R, 104G, and 104B) provided on the substrate 100, and a bank pattern (partition pattern) provided on the substrate 100 and defining the color filters 104. The suffixes R, G, and B given to the color filters 104 indicate colors of light that are transmitted through the respective color filters 104. Namely, the color filters 104R transmit red light, the color filters 104G transmit green light, and the color filters 104B transmit blue light.

The bank pattern has a two-layer structure including a lower bank layer 102 and an upper bank layer 106. The lower bank layer 102 is composed of a light-shielding material such as chromium or a chromium oxide film and functions as a black matrix. The upper bank layer 106 is composed of a macromolecular material such as acrylic resin, polyimide resin, olefin resin, or melamine resin. The lower bank layer 102 includes banks of a uniform cross-sectional thickness. The upper bank layer 106 includes banks 106A, 106B, 106C, 106D, and 106E, which will be described separately below.

The lower bank layer 102 has a plurality of openings 102a, and the upper bank layer 106 has a plurality of openings 106a. The openings 102a overlap the openings 106a, respectively. Each overlapping pair of the opening 102a and the opening 106a communicate with each other, thereby forming a single filter opening.

Referring to FIG. 8, the openings 102a in the lower bank layer 102 are arranged at constant pitches in the x and y directions and have the same planar dimensions. The color filters 104 are in contact with the substrate 100, which is transparent, through the openings 102a. Light is transmitted through the contacts between the substrate 100 and the color filters 104. Each color filter 104 transmits light mainly at a central portion thereof where the color filter 104 overlap the corresponding opening 102a, whereas the color filter 104 does not transmit light at a peripheral portion thereof. Therefore, effective light-transmitting portions of the color filters 104 are arranged at constant pitches in the x and y directions in FIG. 8 and have the same planar dimensions.

Generally, banks of the upper bank layer 106 provided in a peripheral region of the color filter panel have widths smaller than those of banks of the upper bank layer 106 provided in a central region of the color filter panel. Specifically, the bank 106D, which is the second outermost bank of the upper bank layer 106, is formed with a width smaller than that of the bank 106C adjacent thereto on the inner side. The bank 106C is formed with a width smaller than that of the bank 106B adjacent thereto on the inner side. The bank 106B is formed with a width smaller than that of the bank 106A adjacent thereto on the inner side. Exceptionally, the bank 106E, which is the outermost bank, is formed with a width larger than that of the bank 106D adjacent thereto on the inner side. Alternatively, the bank 106E may be formed with a width smaller than that of the bank 106D.

Banks of the upper bank layer 106 in the central region (including a region not shown) of the color filter panel have the same width as that of the bank 106A. The central region of the color filter panel occupies a large proportion of the color filter panel. Therefore, a large proportion of banks of the upper bank layer 106 are actually formed with the same width as the bank 106A.

As described above, in the peripheral region of the color filter panel, widths of the banks of the upper bank layer 106 between adjacent openings in the x direction are generally smaller toward the outer sides of the peripheral region of the color filter panel in the x direction in FIG. 8 (including the outer side not shown). As shown in FIG. 8, in the peripheral region of the color filter panel, widths of the banks of the upper bank layer 106 between adjacent openings in the y direction are smaller toward the outer sides of the peripheral region of the color filter panel in the y direction in FIG. 8.

Such differences in the width of the banks of the upper bank layer 106 make the planar dimensions of the openings 106a provided in the peripheral region of the color filter panel be larger than those of the openings 106a provided in the central region of the color filter panel. The planar dimensions and depths of the openings 102a and the depths of the openings 106a are substantially uniform in any region. Accordingly, the filter openings provided in the peripheral region of the color filter panel have larger capacities. Additionally, in the peripheral region of the color filter panel, since the planar dimensions of the openings 106a become larger toward the outer sides, the capacities of the pixel openings become larger likewise.

Next, a method for manufacturing the color filter panel will be described. First, a half-finished product shown in FIG. 7A is manufactured. Specifically, the lower bank layer 102 is formed with a uniform thickness on the substrate 100 by a known method such as CVD or sputtering, and then is subjected to photolithographic etching, for example, whereby the openings 102a are provided. Thus, portions of the substrate 100 is exposed. The etching may be either dry etching or wet etching.

Further, the upper bank layer 106 is formed with a uniform thickness on the structure obtained as above by a known method such as spin coating, spray coating, roll coating, dye coating, or dip coating, and is subjected to photolithographic etching, for example, whereby the openings 106a are provided. Thus, portions of the substrate 100 are exposed.

In this manner, the half-finished product having a bank pattern shown in FIG. 7A is obtained.

In addition to the above process, oxygen-plasma treatment for giving a liquid affinity characteristic and $CF_4$ plasma treatment for giving liquid-repellency may be performed. With liquid affinity treatment, the liquid affinity characteristic of the lower bank layer 102 with respect to a liquid material for the color filters 104 can be improved. On the other hand, with liquid-repellent treatment, the liquid-repellency of the upper bank layer 106 with respect to a liquid material for the color filters 104 can be improved. By performing such plasma-treatment processes, even if a material not originally having liquid repellency is used for forming the upper bank layer 106, the upper bank layer 106 can be made to be liquid repellent while the liquid affinity characteristic of the lower bank layer 102 is maintained.

Figure 7B:
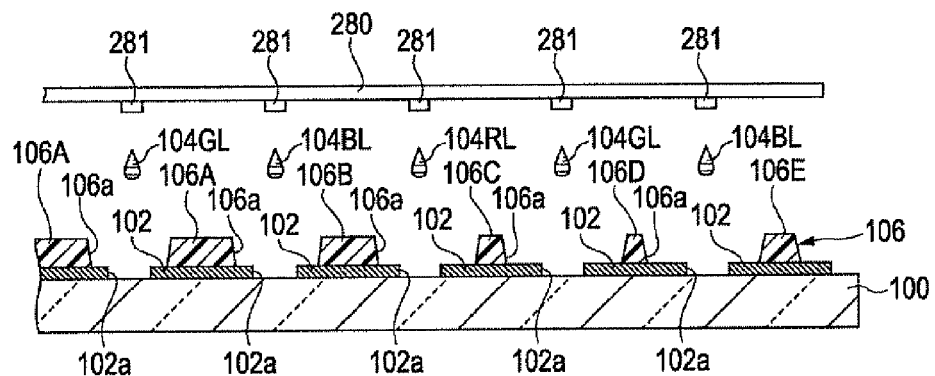
FIG. 7C is another cross-sectional view of the color filter panel showing the method for manufacturing the same.
FIG. 7D is another cross-sectional view of the color filter panel showing the method for manufacturing the same.
Figure 7C:
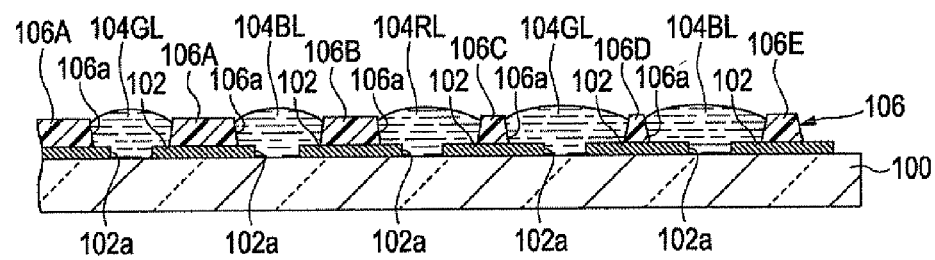
Figure 7D:
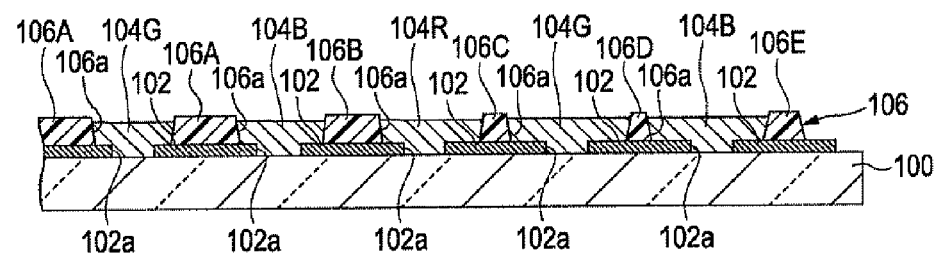
Figure 8:
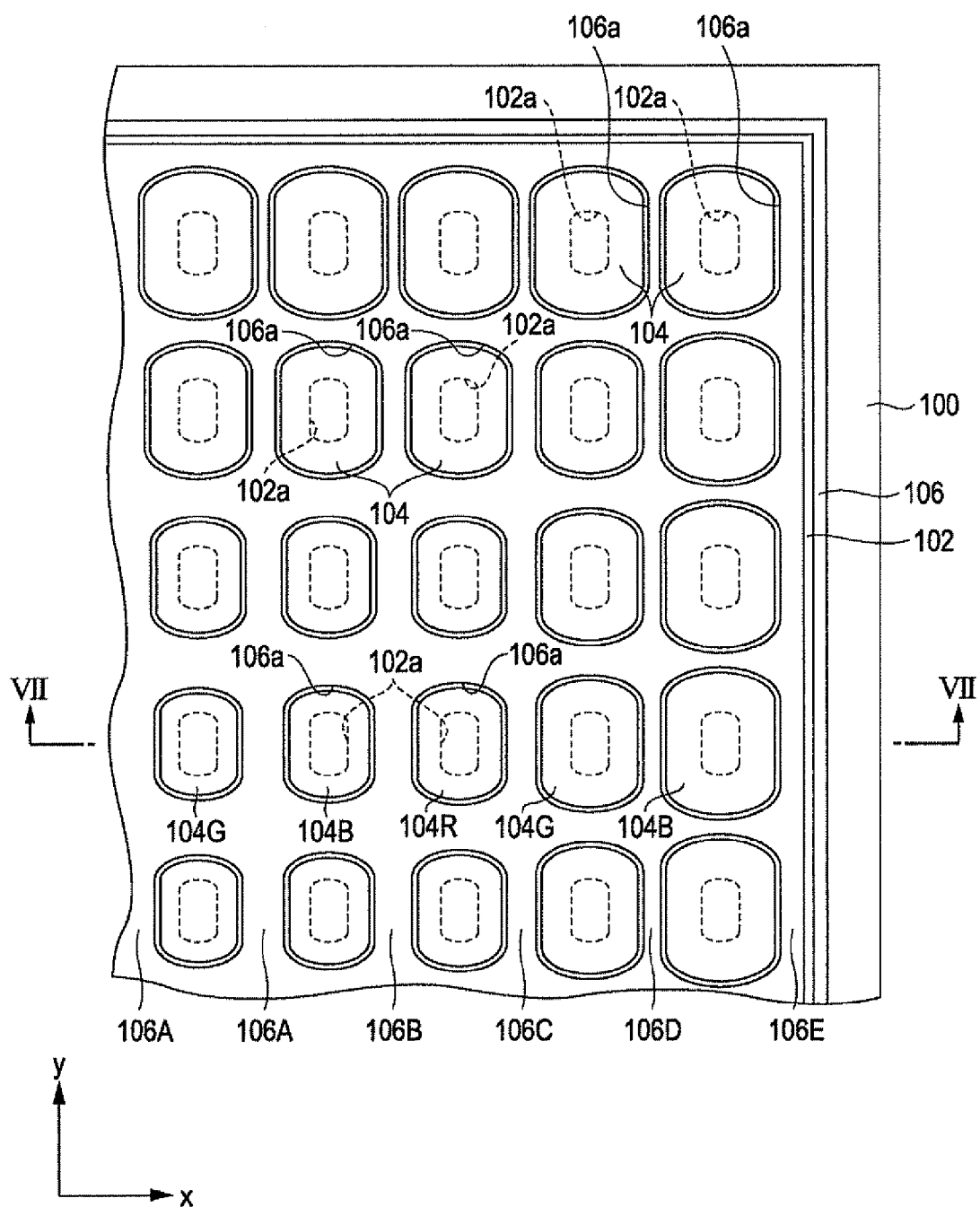
FIG. 8 is a plan view of the color filter panel shown in FIGS. 7A to 7D as a finished product.

Next, referring to FIG. 7B, liquids 104RL, 104BL, and 104GL, which are materials for the color filters 104, are distributed into the respective filter openings. The liquids 104RL, 104BL, and 104GL are ink, for example, containing a solvent such as water or an organic solvent. In the solvent, a pigment or a dye to become the corresponding color filter 104 is dispersed or dissolved as a solute. The liquids 104RL, 104BL, and 104GL can be supplied by an ink jet method, a jet dispensing method, or a dispensing method, for example. In the second embodiment, the ink jet method is taken as an example.

Referring to FIG. 7B, an ink jet head 280 is driven to eject the liquids 104RL, 104BL, and 104GL from nozzles 281 of the ink jet head 280 toward the filter openings, whereby the liquids 104RL, 104BL, and 104GL are supplied to all the respective filter openings. As described above, since the planar dimensions of the openings 106a provided in the peripheral region of the color filter panel are larger than those of the openings 106a provided in the central region of the color filter panel, the filter openings in the peripheral region of the color filter panel have larger capacities than those of the filter openings in the central region. In accordance with this configuration, referring to FIG. 7C, larger amounts of liquids 104RL, 104BL, and 104GL, which are the materials for the color filters 104, are distributed into the filter openings provided in the peripheral region of the color filter panel than in the central region. Further, in the peripheral region of the color filter panel, larger amounts of liquids 104RL, 104BL, and 104GL are distributed into the filter openings provided closer to the outer sides.

To supply larger amounts of liquids 104RL, 104BL, and 104GL in the filter openings closer to the outer sides, any one or any combination of the following methods may be used:

(1) The current or voltage to be applied to piezoelectric elements that control the amount of droplets to be supplied from nozzles is changed in accordance with positions of the filter openings, whereby the amount of a droplet that forms a single dot is changed.

(2) The number of pulses to be applied to piezoelectric elements that control the amount of droplets to be supplied from nozzles is changed in accordance with positions of the filter openings, whereby the number of droplets to be supplied per filter opening is changed.

(3) The number of nozzles to be used per filter opening is changed in accordance with positions of the filter openings, whereby the number of droplets to be supplied per filter opening is changed.

Next, the liquids 104RL, 104BL, and 104GL distributed to the filter openings are dried under vacuum. Consequently, referring to FIG. 7D, the color filters 104 are obtained. In addition, to dry the liquids 104RL, 104BL, and 104GL more sufficiently, the substrate 100 may be annealed. During this drying process, the solvent (water or an organic solvent) contained in the color filters 104R, 104B, and 104G is removed.

In the second embodiment, the planar dimensions of the openings 106a provided in the peripheral region of the color filter panel are larger than those of the openings 106a provided in the central region of the color filter panel. This means that, in the process for distributing the liquids to become the color filters 104, larger amounts of liquids can be provided to the filter openings in the peripheral region of the color filter panel (see FIG. 7C). Therefore, a larger amount of solvent is evaporated in the peripheral region of the color filter panel, whereby variation in the concentration of the solvent in an atmosphere above the entirety of the color filter panel can be reduced. Specifically, the concentration of the solvent in an atmosphere around the peripheral region becomes close to that in an atmosphere above the central region. Thus, variation in the drying rate of the liquids in the color filters 104 arranged in the color filter panel can be reduced. Consequently, nonuniformity in the thickness of the color filters 104 can be reduced, leading to a reduction of nonuniformity in the transmissivity (for example, nonuniformity in the brightness of transmitted light). Moreover, the color filters 104 provided in the peripheral region of the color filter panel are available for practical use. This suppresses increase in the area of a region not contributive to practical use, leading to reduction in the frame width of the organic EL apparatus.

Other Applications

Next, an electronic apparatus to which the organic EL apparatus according to the first or second embodiment (hereinafter referred to as "the present organic EL apparatus") will be described.

Figure 9:
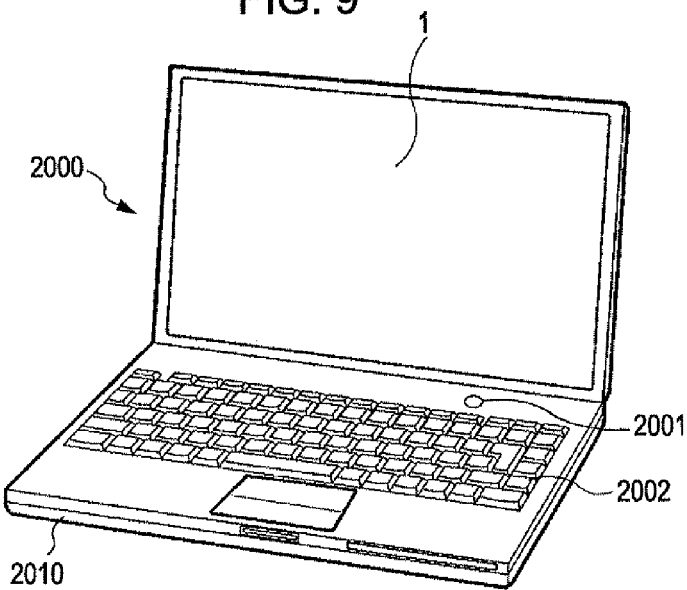
FIG. 9 is a perspective view of an exemplary electronic apparatus including the organic EL apparatus according to the first or second embodiment of the invention.

FIG. 9 is a perspective view showing a mobile personal computer including an image display apparatus to which the present organic EL apparatus is applied. A personal computer 2000 includes an organic EL apparatus 1, serving as a display apparatus, and a body 2010. The body 2010 includes a power switch 2001 and a keyboard 2002.

Figure 10:
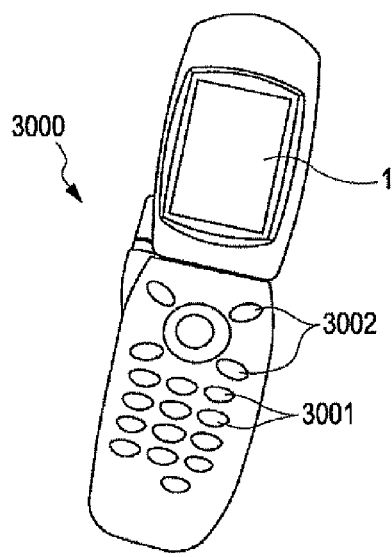
FIG. 10 is a perspective view of another exemplary electronic apparatus including the organic EL apparatus according to the first or second embodiment of the invention.

FIG. 10 shows a mobile phone to which the present organic EL apparatus is applied. A mobile phone 3000 includes a plurality of operation buttons 3001, a plurality of scroll buttons 3002, and an organic EL apparatus 1 serving as a display apparatus. By operating the scroll buttons 3002, the image displayed on the organic EL apparatus 1 is scrolled.

Figure 11:
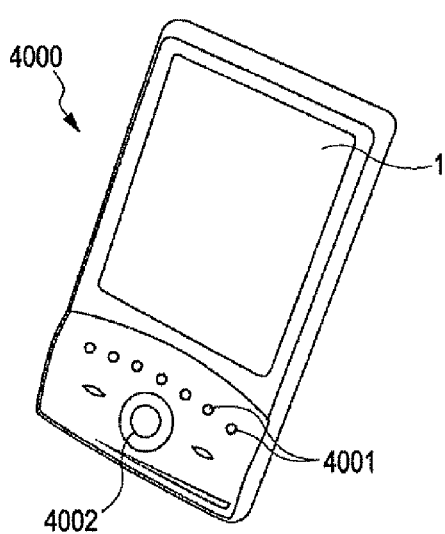
FIG. 11 is a perspective view of another exemplary electronic apparatus including the organic EL apparatus according to the first or second embodiment of the invention.

FIG. 11 shows a personal digital assistant (PDA) to which the present organic EL apparatus is applied. A PDA 4000 includes a plurality of operation buttons 4001, a power switch 4002, and an organic EL apparatus 1 serving as a display apparatus. By operating the power switch 4002, various kinds of information, such as an address file and a schedule file, are displayed on the organic EL apparatus 1.

Electronic apparatuses to which the present organic EL apparatus can be applied as a display apparatus include, other than the ones shown in FIGS. 9 to 11, digital still cameras, televisions, video cameras, car navigation systems, pagers, electronic personal organizers, electronic papers, calculators, word processors, workstations, videophones, point-of-sale (POS) terminals, video players, and other apparatuses having touch panels.

The present organic EL apparatus can also be used as an exposure head of an electrophotographic printer (image printing apparatus) or any of various other illumination apparatuses. Such image printing apparatuses and illumination apparatuses are also regarded as electronic apparatuses according to the invention.

The entire disclosure of Japanese Patent Application No. 2007-238886, filed Sep. 14, 2007 is expressly incorporated by reference herein.

What is claimed is:

1. An organic electroluminescent apparatus comprising:
   a counter electrode;
   a plurality of light-emitting elements arranged in an element area, each of the light-emitting elements having a pixel electrode and an organic layer between the pixel electrode and the counter electrode; and
   a partition pattern separating the plurality of light-emitting elements from each other, wherein the partition pattern includes a first partition pattern having a plurality of first open portions and a second partition pattern having a plurality of second open portions and, in cross-sectional view, the second partition pattern being disposed closer to the counter electrode than the first partition pattern, wherein the organic layers are provided in the first open portions and in the second open portions, wherein in each of the first open portions, at least a portion of the corresponding pixel electrode is in contact with the corresponding organic layer, wherein in plan view, one of the first open portions is positioned in the corresponding second open portion;

wherein all the first open portions have substantially the same planar dimensions; and wherein some of the second open portions provided in a peripheral region to the periphery of the element area have larger planar dimensions than those of other second open portions provided in a region closer to the center of the element area.

2. The organic electroluminescent apparatus according to claim 1, wherein the pixel electrodes are arranged at constant pitches.

3. An electronic apparatus comprising the organic electroluminescent apparatus according to claim 1.

* * * * *